United States Patent [19]

Kilmoyer

[11] 4,406,303
[45] Sep. 27, 1983

[54] GATE VALVE WITH POSITION INDICATOR

[75] Inventor: James E. Kilmoyer, Houston, Tex.

[73] Assignee: ACF Industries, Incorporated, New York, N.Y.

[21] Appl. No.: 289,932

[22] Filed: Aug. 4, 1981

[51] Int. Cl.³ ............................................. F16K 37/00
[52] U.S. Cl. .................................. 137/554; 137/552; 137/559
[58] Field of Search ............... 137/552, 554, 556, 559; 116/277

[56] References Cited

U.S. PATENT DOCUMENTS

| | | | |
|---|---|---|---|
| 2,490,595 | 12/1949 | Merten | 367/171 |
| 3,719,203 | 3/1973 | Wettre | 137/554 |
| 4,213,480 | 7/1980 | Orum et al. | 137/556 |
| 4,232,698 | 11/1980 | Hosterman et al. | 137/557 |

Primary Examiner—Alan Cohan
Assistant Examiner—John A. Rivell
Attorney, Agent, or Firm—Marvin J. Marnock

[57] ABSTRACT

The invention relates to a gate valve (10) having both visual and electrical position indicating means for signalling when the valve is in the fully open and fully closed conditions. A position indicator housing (50) on the valve body (11) receives and accommodates therein a longitudinal valve stem extension (33) of the gate element (15) as the gate element moves between the open and closed positions. The indicator housing (50) is filled with transparent oil and sealed off from fluid communication with the valve chamber (12) and a diaphragm (135) in the wall of the indicator housing accommodates movement of the gate extension (33) inwardly and outwardly of the indicator housing (50) and is exposed to the fluid environments internal and external of said housing to avoid pressure differentials across the housing wall. A pair of proximity sensors (100, 104) with sensing elements (101, 106) of the electrical impedance type are mounted in the indicator housing (50) adjacent the valve stem extension (33) of the gate element at locations corresponding to the extremities of travel of the gate (15) and extension (33) thereof. The sensors energize associated electrical circuit means (FIG. 6) to signal to a remote monitoring facility (M) when the valve (10) is in the fully open or fully closed position. In addition, a pair of viewports (W) are provided in opposed locations of the indicator housing (50), particularly for subsea applications, to permit visual assessment of valve element position.

3 Claims, 6 Drawing Figures

GATE VALVE WITH POSITION INDICATOR

BACKGROUND OF THE INVENTION

This invention relates generally to valves and more particularly to gate valves which may or may not be positioned in a submerged operating condition and which gate valves may be controlled by a remotely energized valve actuator for inducing controlling movement to the gate of the valve. Such valves and valve actuators are frequently utilized in service conditions where the valve is physically located remote from the control and monitoring facility as, for example, when wellhead valves are positioned on the ocean floor and controlled from a platform or from a shore based control facility. When such valves are utilized on remotely located wellheads, it is necessary to know when the valve element is in the fully open or fully closed position in each of the various valves to determine their operative condition and to assure proper control. For this purpose, electrical signals have been used to relay information to the control facility regarding the position of the valve element. In the event an erroneous signal is sent to the control and monitoring facility falsely indicating the position of a wellhead valve, severe damage or even destruction of the wellhead may be caused. Erroneous signals can be generated if the signal is made responsive to the movement of the controlling hydraulic fluid or is made responsive to physical movement of the valve stem or other of the hydraulic operator parts rather than the valve element itself. It is also possible that the gate structure may become disconnected from the valve stem or that some other malfunction may take place within the valve operator such that an erroneous signal is caused to be sent to the monitoring facility.

Most valve and valve operator signal indicator mechanisms rely on movement of hydraulic fluid or upon mechanically or hydraulically energized positioned indicator mechanisms which are related to the valve operator system rather than to the actual position of the gate member of the valve. The results produced by signal indicator systems of this type would not prevent an erroneous position signal from being sent to the monitoring facility in the event the gate becomes disconnected from the valve stem, for example, as sometimes occurs.

U.S. Pat. No. 3,538,948 discloses a gate valve having a gate position indicator which includes reed switches located in the valve chamber and actuated by permanent magnets carried by the valve element to energize an electrical circuit to effect transmission of an electrical signal indicating the position of the gate. In this particular gate valve, it is necessary to employ a protective sleeve to protect the reed switches from flowline fluids which enter the valve chamber. However, in subsea applications, the protective sleeve is susceptible to invasion by salt water whenever a large pressure differential exists between inside the valve housing and outside as occurs at great depths. Thus, pressure differential inside and outside the valve housing limits the depth at which this type of valve can safely be used. Also, the reliability of the indicator mechanism is diminished by the use of reed switches which include moving parts.

Accordingly, an object of the invention is to provide a valve having an internal position indicating means for signalling valve position to a remote monitoring facility which can be used in subsea applications at greater depths than has heretofore been achieved.

A further object is to provide a valve having an internal valve position indicating mechanism with electrical circuit means for electrically signalling valve position to a remote monitoring facility and with improved reliability of the signalling means and position indicating mechanism.

It is a still further object of the invention to provide a valve for subsea applications with a position indicating means responsive to valve element position for transmitting an electrical signal indicative of valve element position and which is also provided with means which are accessible to a diver whereby actual valve element position can be visually determined.

Other objects, advantages and novel features of the invention will be apparent to those of ordinary skills in the art upon examination of the following detailed description of a preferred embodiment of the invention and the accompanying drawings.

SUMMARY OF THE INVENTION

A gate valve including a valve position indicator mechanism is provided which includes electrical circuitry with proximity switches located within an indicator housing and actuable in response to valve element position for transmitting an electrical signal indicative of valve element position to a remote monitoring facility. Since the switches do not include moving parts, reliability of the position indicator mechanism is enhanced. However, as a redundant back up system, the position indicator housing is filled with transparent mineral oil and provided with diver accessible viewports at opposed locations in the indicator housing to permit obtaining a visual indication of valve element position, if necessary. A pressure compensating bellows in the side of the valve housing allows for volume change in the valve chamber caused by the valve stem entering and leaving the chamber and balances fluid pressure inside and outside the valve housing so the valve can be used in subsea applications at great depth.

DETAILED DESCRIPTION OF THE PREFERRED EMBODIMENT

Figure 1:
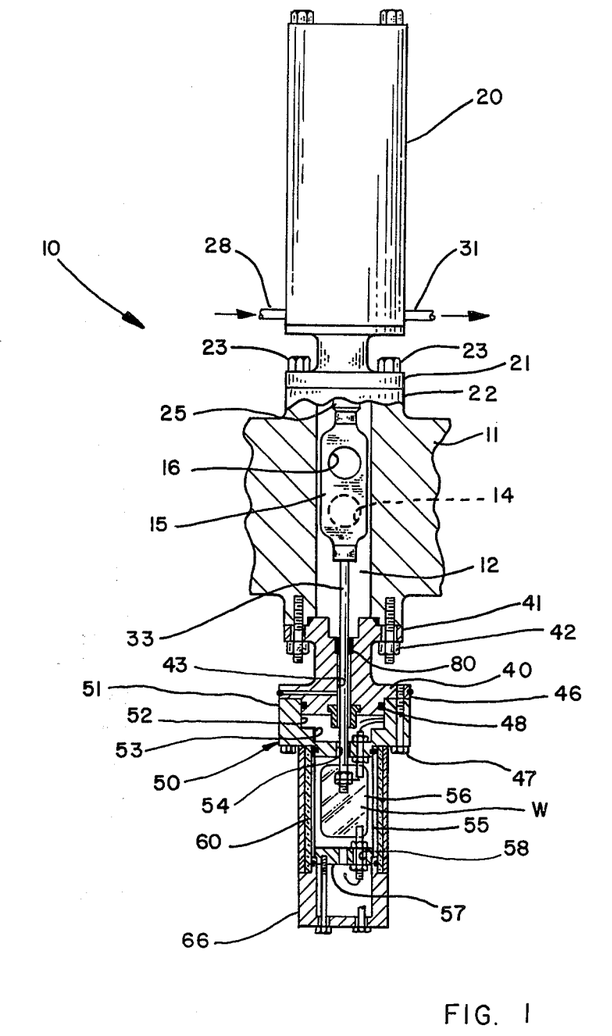
FIG. 1 is a fragmentary elevational view, partly in section, and showing a valve and valve operator assembly in an embodiment which incorporates the invention with the valve in the closed position and oriented to show a viewport in the indicator housing.
Figure 2:
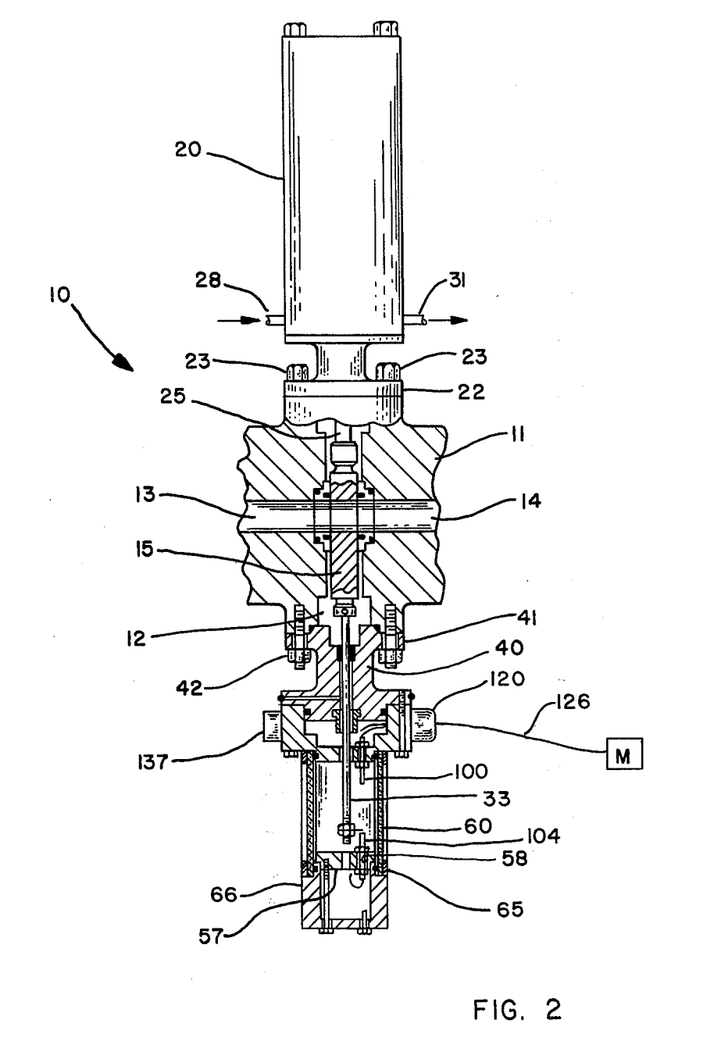
FIG. 2 is a fragmentary elevational view, partly in section, of the valve and valve operator assembly of FIG. 1 and showing the arrangement of the viewports and other elements of the position indicator mechanism with the valve in the open position.

Referring more particularly to the drawings, there is shown in FIG. 1 a gate valve and valve operator assembly 10 which includes a valve body 11 defining a valve chamber 12. The valve body 11 is provided with flow passages 13 and 14 and the valve body is provided with suitable connecting means such as threads or weldments (not shown), whereby the valve can be connected in a flowline with the flow passages 13 and 14 in aligned registry therewith. The flow of fluid through the valve is controlled by a gate member 15 provided with a port 16 therethrough which is adapted to be disposed in communication with the flow passages 13, 14 in the open position of the valve. In FIG. 1 the gate member 15 is illustrated in the closed position of the valve.

The valve operator section of the valve and operator assembly 10 includes an operator assembly 20 having a lower annular connection flange 21 which is adapted to be connected in abutting sealed engagement with the upper end 22 of the valve body 11. The operator body is secured to the valve body 11 by a plurality of studs and nuts 23 which connect the flange 21 to the valve body 11. The valve operator mechanism is preferably of the hydraulic or pneumatic actuation type which includes a cylinder in which is disposed a piston adapted for reciprocal movement therein. Typically, the operator includes an operator valve stem 25 which is connected to the upper end of the gate member 15 and at its upper extremity to the piston (not shown) in the actuator in such manner that movement of the piston will impart corresponding reciprocal movement to the valve stem 25 and the gate member 15. For actuating the valve operator mechanism, the valve operator body 20 is provided with an inlet port 28 which is connectable to a pressurized fluid supply. Such valve operator mechanisms as well known although any suitable valve actuator for actuating a gate member of a gate valve and adapted for subsea applications may be employed.

To close the valve the hydraulic or pneumatic fluid supply system is controlled in such a manner as to allow the fluid to flow freely out of the operator body 20. For this purpose an outlet port 31 is provided in the operator housing 20. When the fluid supply system is co controlled, the operator, most typically by the combination means of a compression spring and fluid pressure acting on the piston structure, will positively urge the piston and valve stem 25 outwardly away from the valve body thereby raising the gate member 15 to a position which blocks the flow of fluid through the valve.

Figure 3:
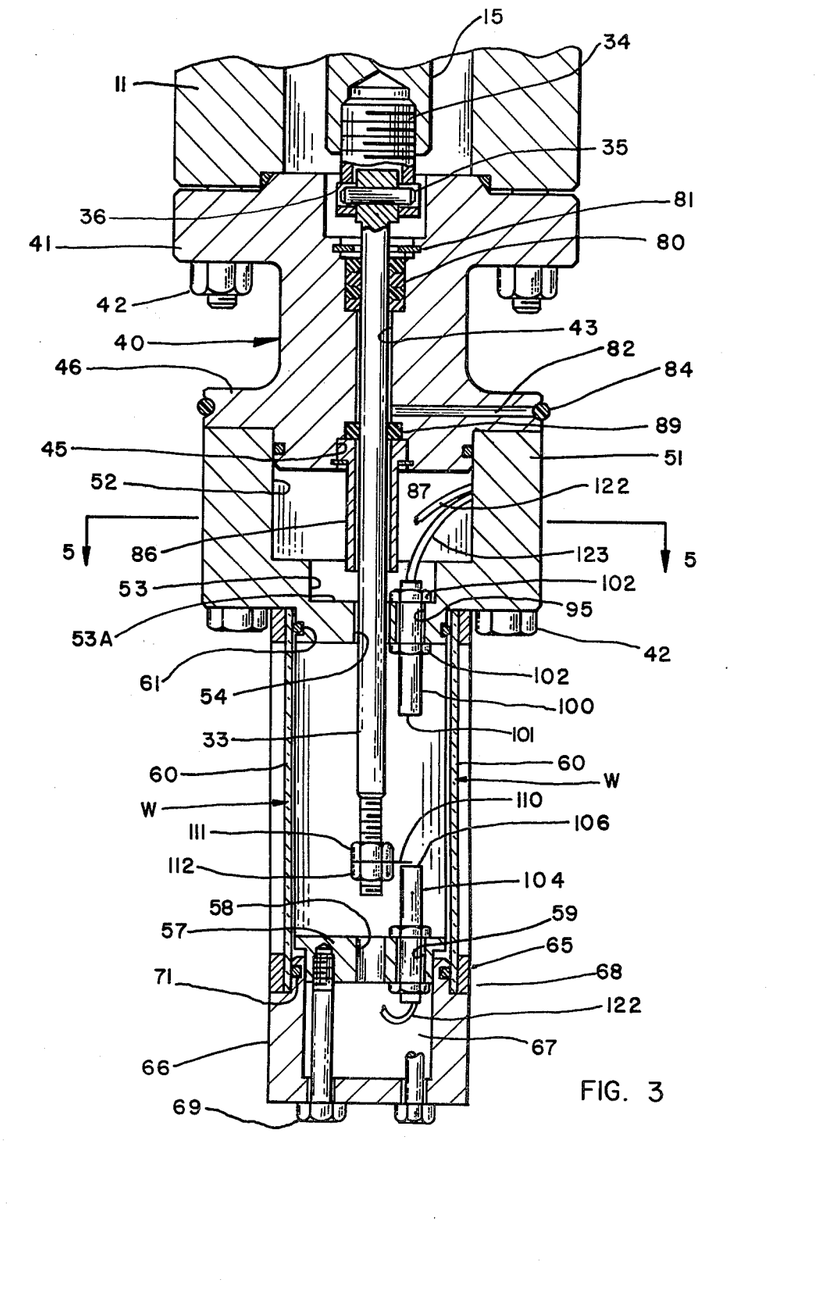
FIG. 3 is a fragmentary sectional view of the valve of FIG. 1 showing details of the position indicator mechanism and the position of the lower valve stem when the valve is open.

Secured to the lower extremity of the gate member 15 is a lower valve stem 33 which is physically secured to the gate member in substantially coaxial alignment with the valve stem 25 affixed at the upper end of the gate member 15. As best seen in FIG. 3, the lower valve stem 33 is suspended from a threaded plug 34 which is externally threaded for connection with a threaded bore provided in the lower extremity of the gate member 15. The upper end of the lower valve stem 33 is inserted in the plug 34 and is suspended therefrom by a pivot pin 35 which extends transversely through a transverse bore in the upper end of the valve stem 33. The ends of the pivot pin 35 are seated in aligned transverse bores 36 provided in the lower end of the plug 34.

Also secured to the valve body 11 is a bonnet 40 which is affixed thereto at the side of the valve chamber remote from the operator 20. The bonnet 40 is provided with an upper annular flange 41 whereby it is secured to the valve body 11 by means of studs and nuts 42 through the flange 41. The bonnet 40 is provided with an axial bore 43 extending therethrough and adapted to receive the valve stem 33. Near its lower end, the bonnet 40 is provided with a radial annular flange 46 for facilitating connection of a position indicator housing 50 to the bonnet 40. The position indicator housing 50 is formed at its upper end with an enlarged cylindrical section 51 provided with a central axial bore 52 with a counterbore 53 of reduced diameter and coaxial therewith and a slotted opening 54 milled in the bottom of bore 53. The indicator housing section 51 is sleeved over the cylindrical lower end of the bonnet 40 so that the upper end of the position indicator housing abuts the underside of the radial flange 46. The indicator housing 50 is secured to the bonnet by a plurality of bolts 47 which extend through the upper cylindrical portion 51 of the indicator housing into accommodating bolt holes in the radial flange 46 of the bonnet. A seal in the connection between the bonnet 40 and the position indicator is provided by means of an O-ring 48 which is inserted in an accommodating annular groove formed in the external wall of the lower end of the bonnet 40.

The lower portion of the position indicator housing 50 is in the form of a cylindrical extension 55 of reduced external diameter as compared to the upper cylindrical end 51. The lower cylindrical extension 55 is coaxially aligned with the upper cylindrical end 51 of the indicator housing and also the bonnet 40 and the valve chamber 12. It is also provided with a large milled slot 56 which extends transversely therethrough. The slot 56 in the extension 55 is in communication with the interior of the upper end 51 of the indicator housing by means of the central slotted opening 54 which extends from the interior bore 53 of the housing section 51 into the transverse slot 56 in the lower indicator housing extension 55. The bottom 57 of the indicator housing 50 is also provided with an aperture 58 and an aperture 59 therethrough which communicates with the slot 56 through the indicator housing extension 55 for purposes to be hereinafter described. Both apertures 58, 59 are offset from the central axis of the housing 50. The bottom end of the cylindrical extension 55 of the indicator housing 50 is also formed with a reduced external diameter for accommodating attachment thereto of an end cap 66.

Sleeved about the lower cylindrical end 55 of the indicator housing throughout its length is a tubular transparent cylinder 60 of LEXAN, a polycarbonate material which is a product of the General Electric Company. The LEXAN cylinder 60 is of only slightly larger diameter than the lower cylindrical extension 55 of the indicator housing so that a seal may be effected therebetween. For this purpose an O-ring 61 is seated in a circumferential annular groove formed in the external wall of the indicator housing extension 55 adjacent the enlarged upper cylindrical portion 51 of the indicator housing for establishing a seal between the LEXAN cylinder 60 and the indicator housing.

Also disposed about the transparent cylinder 60 is an outer steel sleeve 65 which is of slightly larger diameter than the transparent cylinder 60 and of equal length so that a close fitting relationship is established therebetween. The transparent cylinder 60 and the steel outer sleeve 65 are disposed with their upper ends abutting the annular shoulder 51A representing the underside of the enlarged upper end 51 of the indicator housing 50. The outer steel sleeve 65 is provided with slotted openings forming windows "W" in opposed locations in the side wall thereof. The window openings conform in dimensions and configuration to that of the transverse slot 56 through the lower extension 55 of the indicator housing. In assembly, the outer sleeve 65 is oriented so that its window openings are in alignment with the transverse slot 56.

For securing the transparent cylinder 60 and outer sleeve 65, the steel end cap member 66 is attached by a plurality of bolts 69 to the bottom 57 of the indicator housing. The cap 66 is formed with an internal diameter corresponding substantially to, but slightly larger than, the reduced external diameter of the bottom 57 of the indicator housing. The end cap 66 is sleeved about the bottom end of the indicator housing and its dimensions are such that its interior forms a chamber 67 between the bottom end of the extension 55 of the indicator housing and the closed end of the cap for purposes thereinafter described. The open end of the cap is of reduced external diameter with respect to the remainder of the cap and thereby defines an upward facing annular shoulder 68 which seats against the annular surfaces representing the bottom ends of the LEXAN transparent cylinder 60 and the outer steel sleeve 65 to securely hold them in place when the cap 66 is bolted to the bottom end of the indicator housing by the bolts 69. An O-ring 71, installed in an accommodating annular groove which is formed in the external wall of the reduced diameter end of the cap 66, forms a seal between the cap 66 and the inner wall of the transparent LEXAN cylinder 60.

Figure 4:
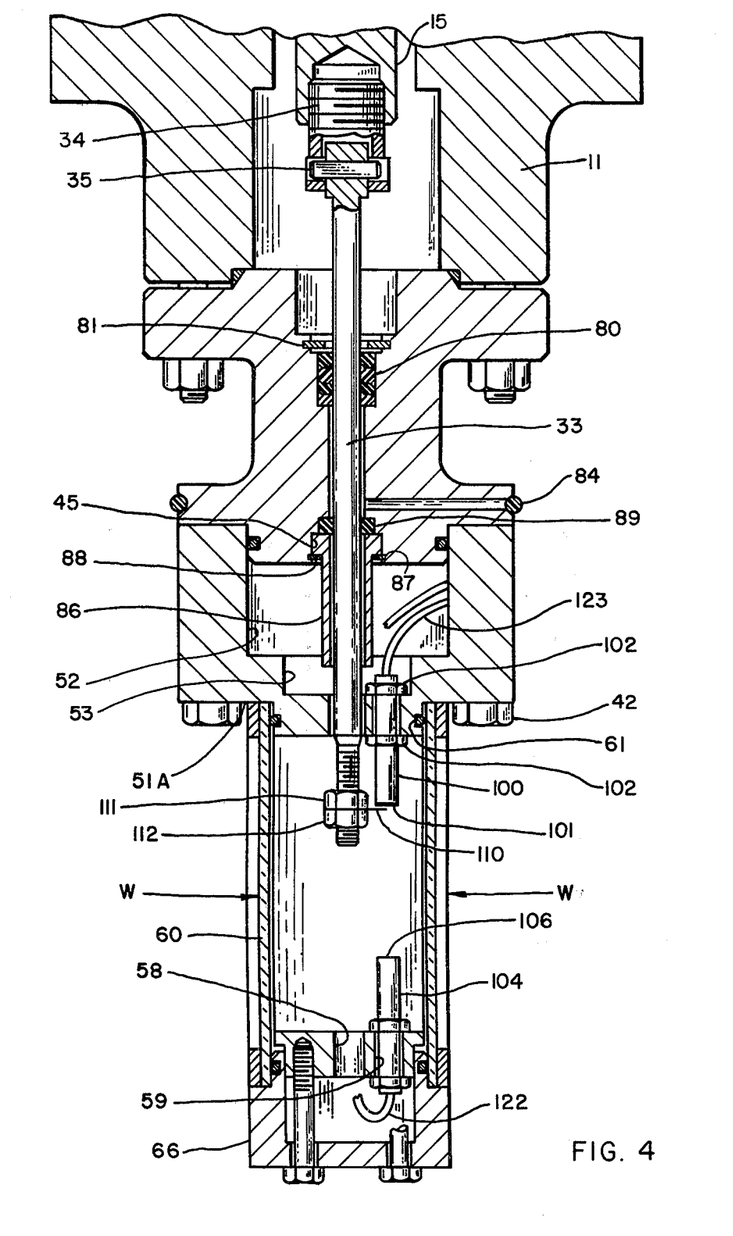
FIG. 4 is a view similar to FIG. 3 but showing the position of the lower valve stem when the valve is closed.

As shown in FIGS. 1 through 4, the lower valve stem 33 extends through the axial bore of the bonnet 40 and into the indicator housing 50 which is designed with sufficient length to accommodate the lower valve stem 33 throughout its range of travel as delimited by the closed and open positions of the valve. As best seen in FIGS. 3 and 4, the axial bore 43 through the bonnet 40 is enlarged at both ends of the bonnet 40. An enlargement of the bonnet axial bore 43 adjacent its upper end accommodates a valve stem packing assembly 80 which seals off the valve chamber 15 from the position indicator housing 50 such that there is no contamination of the interior of the indicator housing with flowline fluids passing through the valve. The indicator housing, for operational purposes, is filled with transparent mineral oil. The principal purpose of the packing assembly 80, however, is to block fluid pressure in the valve chamber from reaching the indicator housing and likely causing its destruction. A packing stop is provided at the top of the packing assembly 80 by means of a snap ring 81 which is disposed in an accommodating annular groove formed in the bore wall of the bonnet bore enlargement 44. In the event, however, there should be some leaking around the valve stem packing 80, a lateral bleeder passage 82 is provided which extends from the axial bore 43 of the bonnet to an external annular groove formed in the peripheral wall of the bonnet's radial flange 46. An O-ring 84 is seated in the annular groove and normally seals off the bleeder passage 82 but permits the escape of fluids and release of pressure from the axial bore 43 should leaking of the packing 80 cause a pressure build up in the bonnet 40 and the position indicator housing.

A protector sleeve 86 which receives the lower valve stem 33 is suspended from the bottom of the bonnet 40 by means of a snap ring 87 fitted in an accommodating annular groove which is formed in the wall of an enlargement 45 of the bonnet bore 43. A downward facing annular shoulder 88 formed by an enlarged upper end of the protector sleeve 86 seats on the snap ring 87. A directional packing 89 is placed atop the sleeve 86 and seals against fluid pressure from the indicator housing 50. The purpose of the protector sleeve 86 is to protect electrical wiring which is part of the position indicator mechanism and disposed in the interior bore of the upper end 51 of the position indicator housing. The wiring is protected from wearing contact with the valve stem 33 which is imparted with axial motion when opening and closing the valve.

As illustrated in detail in FIGS. 3 and 4, the bottom surface 53A of the interior bore of the enlarged upper end 51 of the indicator housing is penetrated by an aperture 95 which opens into the slotted interior of the lower extension 55 of the indicator housing. A proximity sensor 100, encased and hermetically sealed in a housing which is externally threaded throughout its length, is installed in the aperture 95 to extend into the interior of the lower extension 55 of the indicator housing with its sensing face 101 disposed therein. The proximity sensor 100 is fixed in position by means of panel nuts 102. As shown in the drawings, the aperture 95 is in coaxial alignment with the aperture 59 in the bottom 57 of the indicator housing.

Figure 5:
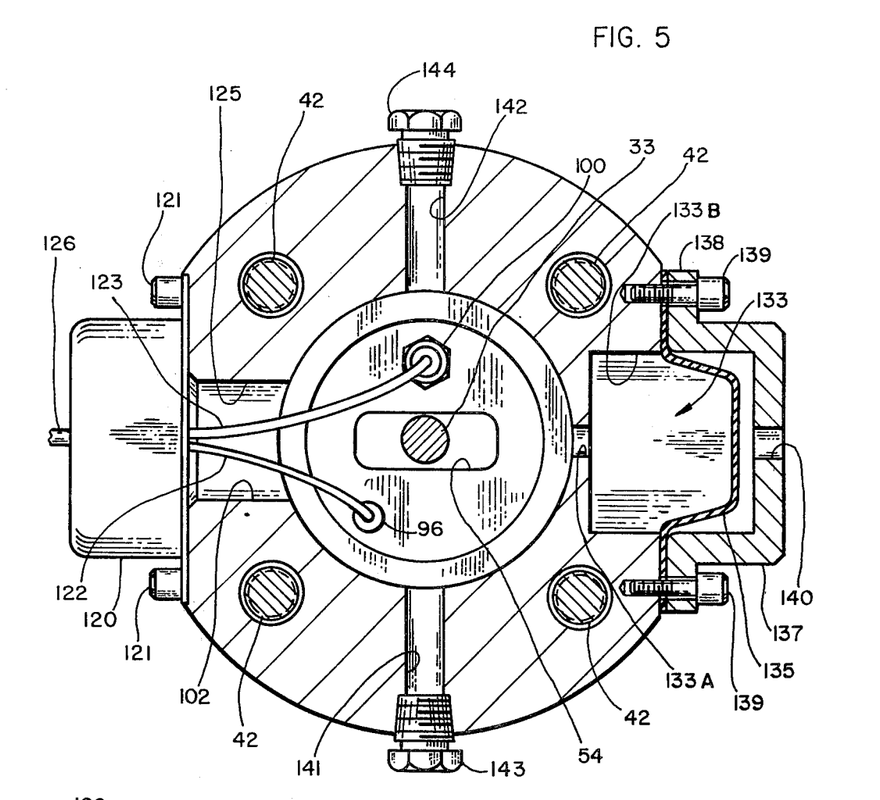
FIG. 5 is a sectional view taken along the line of 5—5 of FIG. 4.

A proximity sensor 104 is installed in aperture 59 in the bottom end 57 of the indicator housing extension 55 and is disposed with its sensing end face 106 facing upwardly in the interior of the indicator housing extension. The proximity sensors are each a component in an associated electrical circuit, and each acts in the manner of a switch to energize its associated electrical circuit to control an indicator such as a lamp or other type of display device. Electrical wiring 122 representing a pair of leads from proximity sensor 104 is fed from the interior of the cap 66 through the aperture 58 in the bottom 57 of the indicator housing into the interior of the indicator housing extension 55. It is also fed through a small opening 96 in the bottom of the upper portion 51 of the indicator housing, as shown in FIG. 5. The wiring 122, together with the wiring 123 which represents a pair of leads from the upper proximity sensor 100, are then fed through an opening 125 in the side wall of the indicator housing for coupling to an electrical connector 120.

Figure 6:
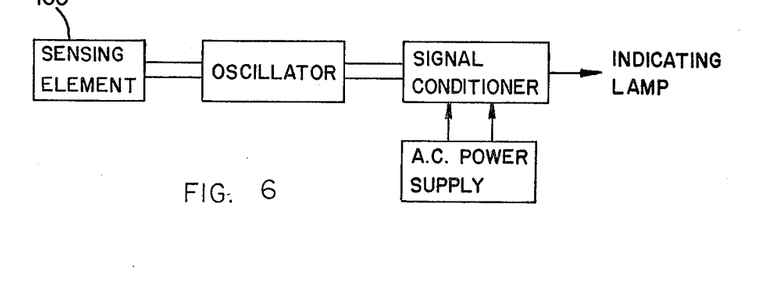
FIG. 6 is a block diagram of a proximity sensor circuit which can be used in the invention.

The proximity sensors 101, 104 are either the inductive or capacitive type and in the cylindrical configuration of the sensor, as herein employed, the sensing element is located at the tip or sensing face end of the sensor. In a typical proximity sensor circuit a high frequency oscillator is employed and in the capacitive type sensor, the oscillator contains a capacitor, one of whose plates is built into the end of the sensor. In the inductive type sensor, the sensing coil is physically located at the tip of the sensor. The coil which may be one leg of an impedance bridge is inductively coupled to the oscillator. With either type of sensor, the oscillating field produced at the sensing element is affected by the presence of a nearby object which changes the impedance of the circuit and the amplitude of the oscillator output. A signal conditioner is then conventionally employed to rectify, integrate and amplify the oscillator output to produce a D.C. analog signal for switching an output transistor or triac stage. The sensor is thus connected in the circuit as a mechanical switch would be connected. A block diagram of a typical sensor circuit is shown in FIG. 6.

A suitable proximity sensor which may be employed with this invention, is a hermetically sealed proximity sensor Model NJI-106M-N-500 bar which is manufactured by R. B. Denison, Inc. and sold by Gould, Inc. This sensor is of the inductive type and the principal circuit components are included in the hermetically sealed housing of the proximity sensor with electrical power supplied to the sensor from the remote monitoring facility.

In the subject invention, a trip spring 110 in the form of a leaf spring or piece of sheet metal is fixed to the lower valve stem 33 near the threaded bottom end thereof by a pair of nuts 111, 112 which are threaded onto the valve stem 33 in a manner to clamp the trip spring 110 between them. The trip spring is oriented towards the proximity sensors so that in the fully open position of the valve, as shown in FIG. 3, with the lower valve stem 33 at the extent of its travel, the trip spring just seats on the sensing face 106 of the proximity sensor 104. The proximity sensor 104 thus activates its associated sensor circuit to indicate to the monitoring facility that the valve element 15 is in the open position for the valve.

When the gate element 15 is moved by the actuator 20 to close the valve, the lower valve stem 33 is at the uppermost extent of its travel, as shown in FIG. 4, and trip spring 110 engages the sensing face 101 of the upper proximity sensor 100 to signal that the valve element and the valve are in the closed condition. In between the fully open and fully closed positions of the valve, the trip spring 110 moves out of contact with and out of the sensing range of the proximity sensors and no signal is sent.

As shown in FIG. 5, the electrical connector 120 is secured to the side of the indicator housing section 51 by bolts 121. The two pairs of leads 122, 123 from the two proximity sensors are fed through the opening 125 which extends through the side wall of the indicator section 51. The four leads from the two proximity sensors are connected to four pins (not shown) in the electrical connector 120. A signal monitoring facility "M" at a remote location is coupled to the electrical connector 120 by a cable 126. Circuits incorporating such proximity sensors are well known, and typically include an indicator light which is turned on at the monitoring facility when the proximity sensor senses a nearby object such as the trip spring 110. The proximity sensor acts, in the manner of a switch, to energize the electrical circuit whenever a metallic object is placed in close proximity to or in contact with the sensing face of the proximity sensor. The circuit transmits the position signal to the remotely located monitoring and control facility. A signal initiated by the trip spring 110 with proximity sensor 100 indicates the valve element and valves are in the closed position and correspondingly a signal initiated by the trip spring 110 with proximity sensor 104 indicates the valve element and valve are in the open position. Actual contact of the trip spring 120 with the sensing face of the proximity sensor is not required although contact with the sensors is not detrimental to the operation of the sensor circuit. To insure that the valve is fully open or fully closed when the signals are transmitted, the proximity sensors have a sensing range in the order of one millimeter or less.

To accommodate volume change as the lower valve stem moves into and out of the indicator housing, a pressure compensating means is provided. For this purpose, the indicator housing section 51 is provided with a lateral opening 133 in the wall thereof. The lateral opening comprises a small diameter bore section 133A opening to the interior and a large diameter bore section 133B opening to the exterior. The bore 133B, however, is completely covered by a flexible diaphragm 135 of silicone rubber or the like. A perforated metallic cap 137 is placed over the diaphragm and secures the diaphragm to the indicator housing. The cap is provided with an annular flange 138 which overlaps the peripheral margin of the diaphragm and bolts 139 are inserted therethrough for securing the cap and diaphragm. The cap 137 is provided with a central perforation 140. At depths where the sea pressure exceeds the fluid pressure in the indicator housing, the diaphragm is flexed inwardly to balance the pressure inside and outside the indicator housing.

The diaphragm's primary function is to compensate for volume change inside the indicator assembly which occurs when the lower valve stem moves into and out of the indicator housing. Otherwise a "hydraulic lock" would occur when the indicator housing is filled with oil. If no oil were put into the indicator housing an absolute seal would be required in the indicator housing to keep the pressure of deep water from forcing salt water into the housing and fouling the electrical wiring. The diaphragm also equalizes the outside pressures of the sea water with the inside static pressure in the indicator housing. The diaphragm thus acts as a pressure compensating bellows to avoid pressure differentials across the indicator housing and makes it possible to use the valve in water depths to 15,000 feet, which is the limiting depth for the proximity sensor housings.

For filling the indicator housing 50 with mineral oil, the indicator housing section 51 is provided with a pair of small diameter ports 141, 142 extending laterally through the wall thereof. Whichever of the ports 141, 142 is used as a fill port, the other is used as a vent port for venting air from the indicator housing during the filling operation. Threaded plugs 143, 144 are provided for the ports 141, 142, respectively, to seal the indicator housing after filling.

It will therefore be seen that the valve of this invention is provided with an electrical valve position indicating means and a visual indicating means. The windows "W" in the indicator housing section 55 provide view-ports located 180° apart with respect to the indicator housing and through which a diver can visually determine the actual position of the valve stem 35 and the gate element 15. The transparency of the LEXAN cylinder 60 and the mineral oil in the indicator housing facilitates the visual assessment. In murky waters, the opposed location of the viewports or windows "W" makes it possible for a diver to use a hand held light at one window to silhouette the stem and enhance its visibility at the other window.

It will also be seen that the invention permits a positive indication of valve element position to be obtained when the valve element is in its fully open or fully closed position and with greater reliability than has heretofore been achieved since the electrical sensor circuitry does not employ mechanical switches or switches with moving parts. Also, in the event the hydraulic or pneumatic actuating mechanism or the valve stem is damaged or in the event of other malfunction which prevents proper positioning of the gate or valve element, an erroneous signal will not be sent to the monitoring station because the position signal is responsive only to the precise position of the valve element. In the event the gate or valve element fails to move or only moves partially between its open and closed positions, the monitoring facility will readily detect this condition and corrective steps may be initiated to correct this condition.

It is also to be understood that the foregoing description of the invention has been presented for purposes of illustration and explanation and is not intended to limit the invention to the precise form disclosed as changes in details of the illustrated construction may be made by those skilled in the art, within the scope of the appended claims, without departing from the spirit of the invention.

What is claimed is:

1. A valve for subsea applications, said valve having a valve body defining a valve chamber and having inlet and outlet flow passages in fluid communication with the valve chamber, a valve element within said valve chamber and being movable between open and closed positions thereof for controlling the flow of fluid through said flow passages;

means for imparting movement to said valve element between said open and closed positions;

a valve position indicator housing attached to said valve body, said housing being filled with a transparent oil or other electrically non-conductive, non-corrosive liquid;

an extension member secured to said valve element and extending from said valve element into said indicator housing, said extension member being movable within said indicator housing between a first position wherein said valve element closes said valve and a second position wherein said valve element opens said valve;

means for sealing off said indicator housing from fluid communication with said valve chamber;

a diaphragm means comprising a diaphragm installed in the wall of said indicator housing in a position exposed to the fluid within said indicator housing and the fluid pressure external of said housing to thereby avoid pressure differentials across said housing, said diaphragm means being responsive to the movement of said valve element extension member inwardly and outwardly of said indicator housing to accommodate volume changes induced in said indicator housing by said extension member;

circuit means for transmitting valve position signals to signal receiving apparatus when said valve element is in said closed and open positions, said circuit means comprising a first electrical impedance element fixed in said indicator housing at a location adjacent said extension member corresponding to a first extremity of movement of said valve element and extension member when said valve element closes said valve, and a second electrical impedance element fixed in said indicator housing at a location adjacent said extension member and corresponding to the second extremity of movement of said valve element and extension member when said valve element opens said valve, with the spacing between said first and second electrical impedance elements corresponding substantially to the extent of travel of said extension member between said first and second positions;

a metallic appendage affixed to said extension member and disposed along the path between said first and second electrical impedance elements whereby movement of said valve element to the open or closed positions causes said appendage to move in contact or in proximity to one of said electrical impedance elements as to affect the electrical impedance thereof;

said circuit means being responsive to impedance changes induced in said first and second impedance elements by proximity to or in contact with said appendage on said extension member when in said first and second positions for producing electrical output signals indicating when said valve element is in the closed and open positions.

2. A valve as set forth in claim 1 further including transparent window means provided in said indicator housing whereby the actual position of said valve element can be readily determined by visual observation through said window means.

3. A valve as set forth in claim 2 wherein said window means comprises a pair of transparent viewports provided at opposed locations in said indicator housing.

* * * * *